(12) United States Patent
Mizusawa et al.

(10) Patent No.: US 8,907,545 B2
(45) Date of Patent: Dec. 9, 2014

(54) CRYSTAL ELEMENT AND CRYSTAL DEVICE

(75) Inventors: Shuichi Mizusawa, Saitama (JP);
Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 339 days.

(21) Appl. No.: 13/597,261

(22) Filed: Aug. 29, 2012

(65) Prior Publication Data

US 2013/0063002 A1  Mar. 14, 2013

(30) Foreign Application Priority Data

Sep. 12, 2011 (JP) ................................ 2011-198094

(51) Int. Cl.
*H01L 41/047* (2006.01)
*H03H 9/05* (2006.01)
*H03H 9/10* (2006.01)
*H03H 9/13* (2006.01)

(52) U.S. Cl.
CPC ........... *H03H 9/0595* (2013.01); *H03H 9/1021* (2013.01); *H03H 9/1035* (2013.01); *H03H 9/132* (2013.01)
USPC ............ 310/344; 310/348; 310/365; 310/367

(58) Field of Classification Search
CPC ... H03H 9/1021; H03H 9/1014; H01L 41/053
USPC .................. 310/344, 348, 365, 367
See application file for complete search history.

(56) References Cited

U.S. PATENT DOCUMENTS

| | | | |
|---|---|---|---|
| 2010/0201229 A1* | 8/2010 | Saito ............................. | 310/370 |
| 2011/0203083 A1* | 8/2011 | Sasaki et al. ................. | 29/25.35 |
| 2011/0227457 A1* | 9/2011 | Ishikawa et al. ............. | 310/344 |
| 2012/0056514 A1* | 3/2012 | Ishikawa et al. ............. | 310/344 |
| 2012/0212105 A1* | 8/2012 | Sekiguchi ..................... | 310/344 |
| 2012/0242193 A1* | 9/2012 | Shimao et al. ................ | 310/348 |

FOREIGN PATENT DOCUMENTS

JP      H06-006166      1/1994

* cited by examiner

*Primary Examiner* — Derek Rosenau
*Assistant Examiner* — Bryan Gordon
(74) *Attorney, Agent, or Firm* — Jianq Chyun IP Office

(57) ABSTRACT

A mesa-structure crystal element includes a circumferential portion having a thin thickness, a first convex portion formed on a plane in a center side from the circumferential portion and having a first height from the circumferential portion in a first principal face and a first planar shape, and a second convex portion formed in a center side from the circumferential portion and having a second height from the circumferential portion in a second principal face opposite to the first principal face and a second planar shape, wherein at least one of an area and a planar shape is different between the first planar shape of the first convex portion and the second planar shape of the second convex portion, or the first height of the first convex portion is different from the second height of the second convex portion.

8 Claims, 8 Drawing Sheets

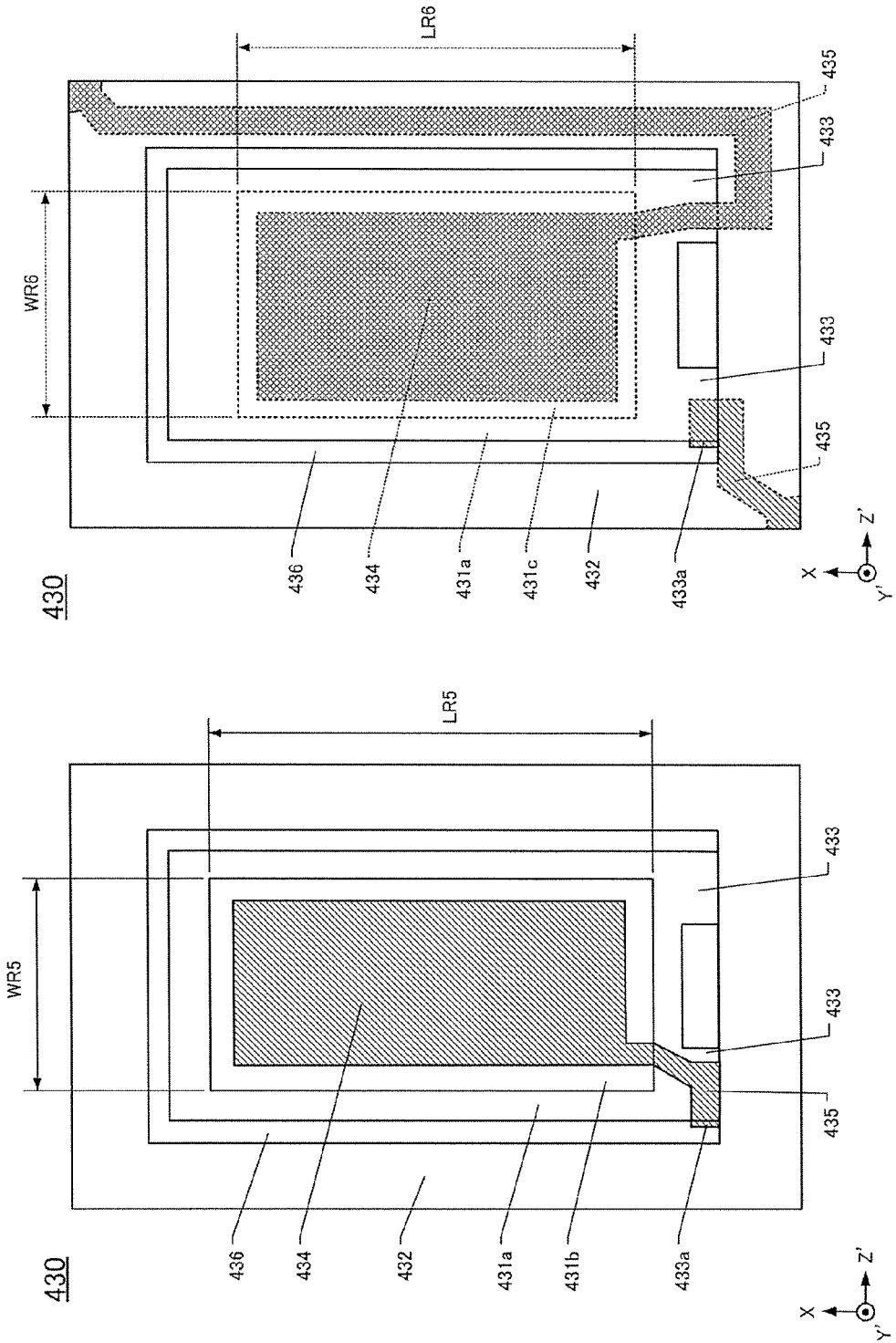

CRYSTAL ELEMENT AND CRYSTAL DEVICE

CROSS-REFERENCE TO RELATED APPLICATIONS

This application claims the priority benefit of Japan application serial no. 2011-198094, filed on Sep. 12, 2011. The entirety of the above-mentioned patent application is hereby incorporated by reference herein and made a part of this specification.

FIELD

This disclosure relates to a crystal element and a crystal device capable of suppressing generation of frequencies other than a fundamental wave.

DESCRIPTION OF THE RELATED ART

There is known a crystal element that vibrates at a predetermined frequency by applying a voltage. The crystal element is encapsulated with a package and the like and is used as a crystal device. Such a crystal element is used to oscillate, for example, a fundamental wave. However, even when the fundamental wave is used, frequencies such as a third overtone other than the fundamental wave may be generated. Such frequencies other than the fundamental wave may generate erroneous operation in a circuit due to interference after the crystal device is mounted on the circuit.

In order to prevent such erroneous operation, for example, Japanese Patent Publication No. H06-006166 discloses a technique in which a surface acoustic wave filter is formed in the crystal element to detect only a predetermined frequency.

However, in recent years, as the crystal element is miniaturized, and a convex portion is formed on both principal faces of the crystal element to reduce a crystal impedance (CI) value, it is difficult to reserve a space for forming the surface acoustic wave filter in the crystal element as disclosed in Japanese Patent Publication No. H06-006166.

A need thus exists for a crystal element and a crystal device capable of suppressing generation of frequencies other than the fundamental wave by forming the convex portion in both principal faces of the crystal element oscillating a fundamental wave such that at least one of the planar shape, the area, and the height thereof are different.

SUMMARY

According to a first aspect of this disclosure, there is provided a mesa-structure crystal element including: a circumferential portion having a thin thickness; a first convex portion formed in a center side from the circumferential portion and having a first height from the circumferential portion in a first principal face and a first planar shape; and a second convex portion formed in a center side from the circumferential portion and having a second height from the circumferential portion in a second principal face opposite to the first principal face and a second planar shape, wherein at least one of an area and a planar shape is different between the first planar shape of the first convex portion and the second planar shape of the second convex portion, or the first height of the first convex portion is different from the second height of the second convex portion.

According to another aspect of this disclosure, there is provided a crystal device including: the crystal element described above, the crystal element having an excitation electrode formed in the first and second convex portions and an extraction electrode extracted from the excitation electrode to the circumferential portion; a base plate that has a connecting electrode connected to the extraction electrode and houses the crystal element; and a lid plate bonded to the base plate to encapsulate the crystal element.

According to still another aspect of this disclosure, there is provided a crystal device including: the crystal element described above, the crystal element having an excitation electrode formed in the first and second convex portions and an extraction electrode extracted from the excitation electrode through the connecting portion to the frame; a base plate that has a connecting electrode connected to the extraction electrode and is bonded to the frame; and a lid plate bonded to the frame to encapsulate the crystal element.

BRIEF DESCRIPTION OF THE DRAWINGS

The foregoing and additional features and characteristics of this disclosure will become more apparent from the following detailed description considered with the reference to the accompanying drawings, wherein:

FIG. 7A is a top plan view illustrating the +Y'-axis side of the crystal element 430;

FIG. 7B is a top plan view illustrating the −Y'-axis side face of the crystal element 430 as seen from the +Y'-axis side;

DETAILED DESCRIPTION

Hereinafter, preferable embodiments of the disclosure will be described in detail with reference to the accompanying drawings, which are not intended to particularly limit the scope of the invention unless specified otherwise.

First Embodiment

<Configuration of Crystal Device 100>

Figure 1:
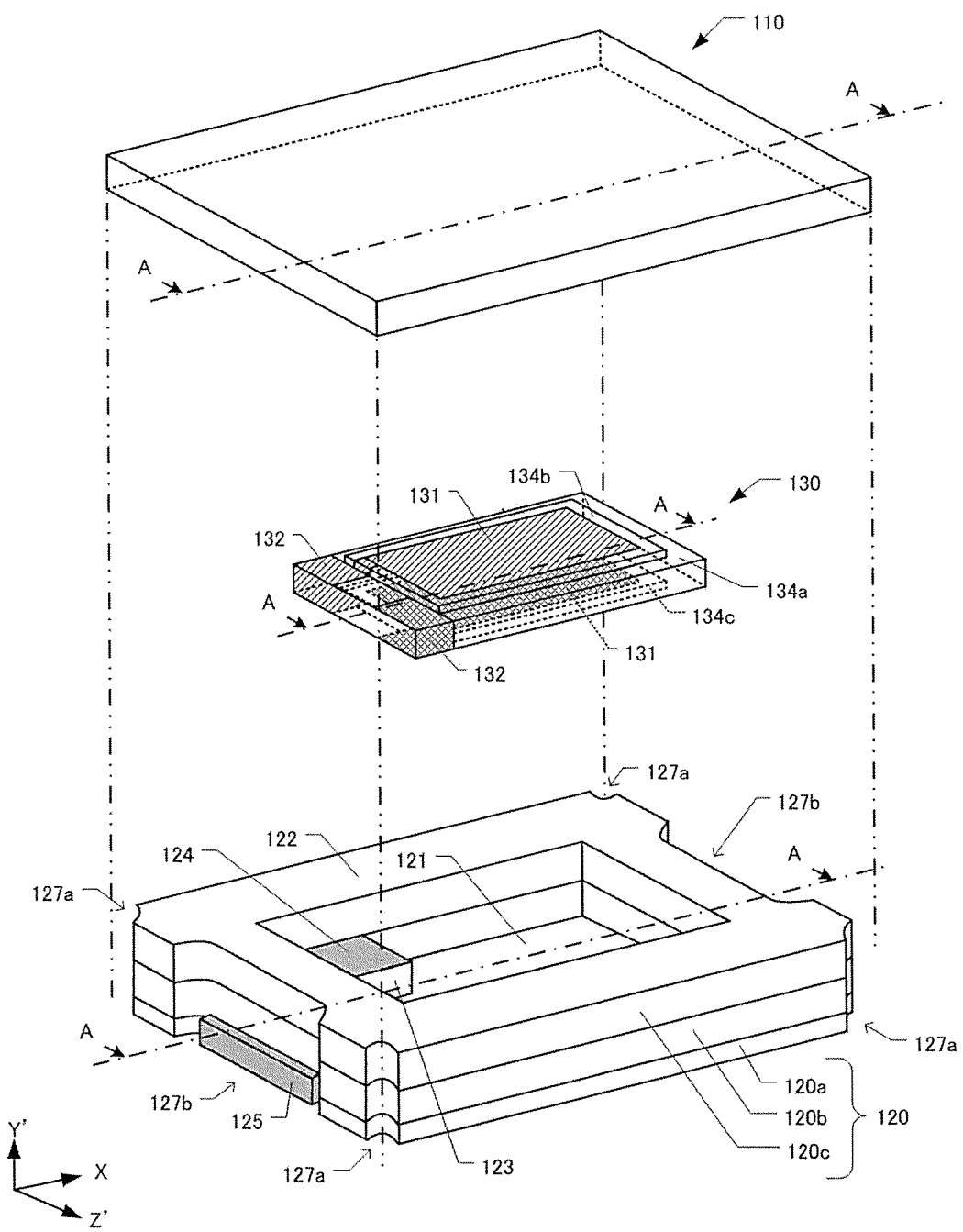
FIG. 1 is an exploded perspective view illustrating a crystal device 100.

FIG. 1 is an exploded perspective view illustrating a crystal device 100. The crystal device 100 includes a crystal element 130, a lid plate 110, and a package 120. For example, an AT-cut crystal element is used in the crystal element 130. The AT-cut crystal element has a principal face (YZ plane) passing through the X-axis and inclined by 35° 15' from the Z-axis in the Y-axis direction of the crystal axes in the XYZ coordinate system. In the following description, Y' and Z' axes inclined with respect to the axial direction of the AT-cut crystal element are newly defined. Specifically, the longitudinal direction of the crystal device 100 is defined as the X-axis direction, the height direction of crystal device 100 is defined as the Y'-axis direction, a direction perpendicular to the X and Y' axes direction is defined as the Z'-axis direction.

In the crystal device 100, the crystal element 130 is placed on the hollow portion 121 formed in the +Y'-axis side of the package 120. In addition, the lid plate 110 is bonded to the +Y'-axis side face of the package 120 to hermetically seal the hollow portion 121 where the crystal element 130 is placed, so that the crystal device 100 is formed.

The crystal element 130 is a mesa-structure crystal element including a circumferential portion 134a formed in the circumference of the crystal element 130, a first convex portion 134b formed in the center side from the circumferential portion 134a of the +Y'-axis side face of the crystal element 130, and a second convex portion 134c formed in the center side from the circumferential portion 134a of the −Y'-axis side face of the crystal element 130. The excitation electrode 131 is respectively formed on the surfaces of the first convex portion 134b and the second convex portion 134c. The extraction electrode 132 is extracted from each excitation electrode 131 to the circumferential portion 134a in the −X-axis side. The electrodes such as the excitation electrode 131 and the extraction electrode 132 formed in the crystal element 130 are provided, for example, by forming a chrome layer (Cr) on the crystal element 130 and forming a gold layer (Au) on the chrome layer.

The crystal device 100 is a surface-mounted crystal device in which the mounting terminal 125, the print board, and the like are fixed and electrically connected through soldering for mounting. The −Y'-axis side face of the package 120 is a mounting face for mounting the crystal device 100, and a pair of mounting terminals 125 (referring to FIG. 2) are formed in the mounting face. In addition, the package 120 is formed in a rectangular shape, castellated portions 127a are formed in four corners of the outer wall of the package 120, and the castellated portion 127b is formed in the center of the short side. A part of the mounting terminal 125 is formed in the castellated portion 127b. A hollow portion 121 is formed in the +Y'-axis side face of the package 120. A deck portion 123 for placing the crystal element 130 is formed in the bottom face formed in the hollow portion 121 oppositely to the mounting face, and a connecting terminal 124 is formed in the +Y'-axis side face of the deck portion 123. The connecting terminal 124 and the mounting terminal 125 are electrically connected to each other. In addition, a bonding face 122 bonded to the lid plate 110 is formed around the hollow portion 121 of the package 120. The package 120 is formed of, for example, ceramic, and the package 120 has a three-layered structure. A first layer 120a is formed on a plane and is arranged in the −Y'-axis side of the package 120. The −Y'-axis side face of the first layer 120a is a mounting face, where the mounting terminal 125 is formed. A second layer 120b is arranged in the +Y'-axis side of the first layer 120a. A through-hole which forms a part of the hollow portion 121 is formed in the center of the second layer 120b. In addition, in the second layer 120b, the deck portion 123 is formed in the hollow portion 121, and the connecting terminal 124 is formed in the +Y'-axis side face of the deck portion 123. A third layer 120c is arranged in the +Y'-axis side face of the second layer 120b. A through-hole which forms a part of the hollow portion 121 is formed in the center of the third layer 120c. In addition, a bonding face 122 is formed in the +Y'-axis side face of the third layer 120c. The electrodes such as the connecting terminal 124 and the mounting terminal 125 are provided, for example, by forming a tungsten layer on ceramic, forming a nickel layer as a base plating thereon, and forming a gold layer as a finish plating thereon.

The lid plate 110 is formed as a planar plate. The lid plate 110 is bonded to the bonding face 122 formed in the +Y'-axis side face of the package 120 by interposing the sealing material 142 (referring to FIG. 1B), so that the hollow portion 121 of the package 120 is hermetically sealed.

Figure 2:
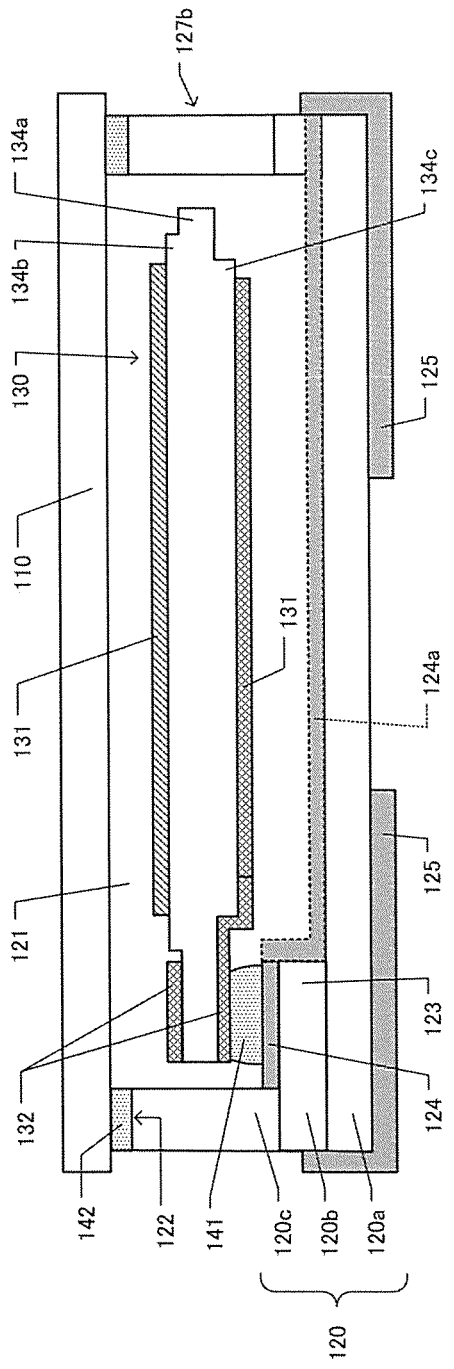
FIG. 2 is a cross-sectional view taken along a line A-A of FIG. 1.

FIG. 2 is a cross-sectional view taken along a line A-A of FIG. 1. The deck portions 123 are formed in each of the +Z'-axis side and the −Z'-axis side of the −X-axis side of the hollow portion 121 of the package 120. The connecting terminal 124 is formed in the +Y'-axis side face of each deck portion 123. The crystal element 130 is placed on the deck portion 123, and the extraction electrode 132 and the connecting terminal 124 are electrically connected through the conductive adhesive 141. The lid plate 110 bonded to the +Y'-axis side of the package 120 is bonded to the bonding face 122 of the package 120 by interposing the sealing material 142 to hermetically seal the hollow portion 121 of the package 120. In addition, a pair of mounting terminals 125 are formed in a part of the castellated portion 127b and the −Y'-axis side face of the package 120. The connecting terminal 124 is electrically connected to the mounting terminal 125 formed in the castellated portion 127b through the connecting electrode 124a formed in the bottom face of the package 120.

Figure 3A:
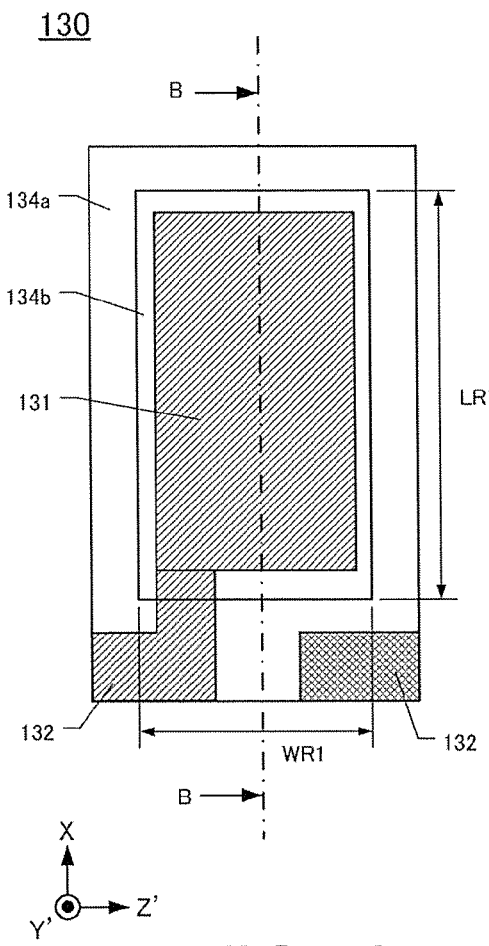
FIG. 3A is a top plan view illustrating +Y'-axis side face of the crystal element 130.

FIG. 3A is a top plan view illustrating the +Y'-axis side face of the crystal element 130. The first convex portion 134b is formed in the +Y'-axis side face of the crystal element 130, and the circumferential portion 134a is formed around the first convex portion 134b. The excitation electrode 131 is formed in the +Y'-axis side face of the first convex portion 134b, and the extraction electrode 132 is extracted from the excitation electrode 131 to the −Z'-axis side of the −X-axis side of the circumferential portion 134a. This extraction electrode 132 is extracted to the −Y'-axis side face through the −Z'-axis side lateral face of the circumferential portion 134a (refer to FIG. 3B). Meanwhile, the extraction electrode 132 extracted from the −Y'-axis side face of the crystal element 130 is formed in the +Z'-axis side of the −X-axis side of the circumferential portion 134a. In addition, the X-axis directional length of the first convex portion 134b is set to the length LR1, and the Z'-axis directional length is set to the length WR1.

Figure 3B:
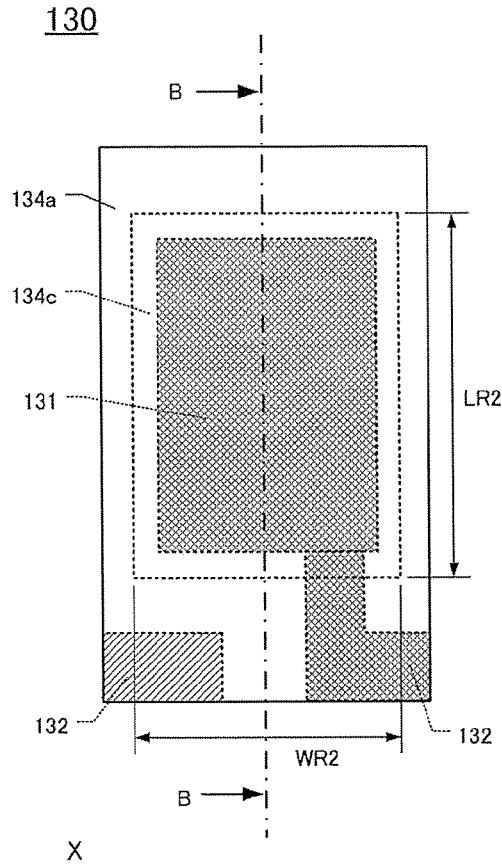
FIG. 3B is a top plan view illustrating the −Y'-axis side face of the crystal element 130 as seen from the +Y'-axis side.

FIG. 3B is a top plan view illustrating the −Y'-axis side face of the crystal element 130 as seen from the +Y'-axis side. FIG. 3B is a top plan view illustrating the −Y'-axis side face of the crystal element 130 as seen from the +Y'-axis side of the crystal element 130 through the crystal element 130. The second convex portion 134c is formed in the −Y'-axis side face of the crystal element 130, and the circumferential portion 134a is formed around the second convex portion 134c. The excitation electrode 131 is formed in the −Y'-axis side face of the second convex portion 134c, and the extraction electrode 132 is extracted from the excitation electrode 131 to the +Z'-axis side of the −X-axis side of the circumferential portion 134a. The extraction electrode 132 is further extracted to the +Y'-axis side face of the circumferential portion 134a through the +Z'-axis side lateral face of the circumferential portion 134a (referring to FIG. 3A). Meanwhile, the extraction electrode 132 extracted from the +Y'-axis side face of the crystal element 130 is formed in the −Z'-axis side of the −X-axis side of the circumferential portion 134a. In addition, the +X-axis directional length of the second convex portion 134c is set to the length LR2, and the +Z'-axis directional length is set to the length WR2.

Figure 3C:
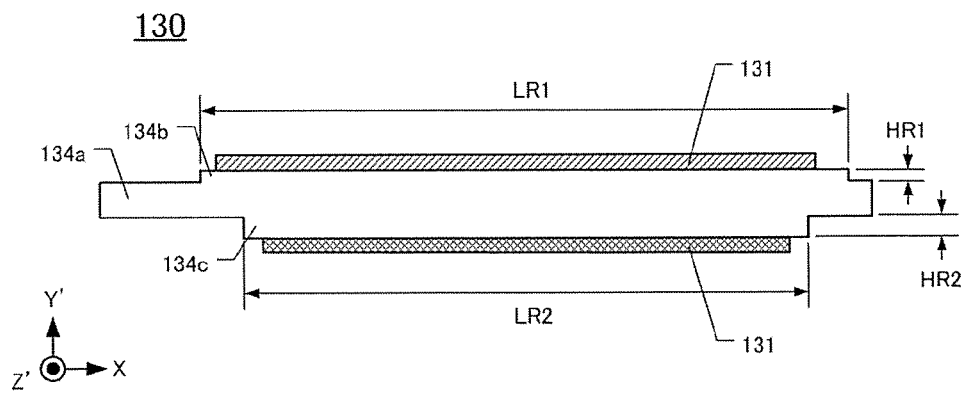
FIG. 3C is a cross-sectional view illustrating the crystal element 130.

FIG. 3C is a cross-sectional view illustrating the crystal element 130. FIG. 3C is a cross-sectional view taken along a line B-B of FIG. 3A and FIG. 3B. In the crystal element 130, the first convex portion 134b is formed to have a first height HR1 from the circumferential portion 134a, and the second convex portion 134c is formed to have a second height HR2 from the circumferential portion 134a.

The crystal element where a fundamental wave is used is preferably designed to have a larger difference between a triple frequency of the fundamental wave and a third overtone frequency. If the difference between the triple frequency of the fundamental wave and the third overtone frequency is large, the third overtone is not generated easily. The fundamental wave of the crystal element is generated in the second convex portion and the first convex portion where the excitation electrode is formed. That is, when the shape or the like of the first or second convex portion changes, a vibration displacement distribution of the crystal element changes. Accordingly, a difference between the triple frequency of the fundamental wave and the third overtone frequency also changes.

The crystal element 130 is formed to have a large difference between the triple frequency of the fundamental wave and the third overtone frequency by adjusting the X-axis directional length, the Z'-axis directional length, and the Y'-axis directional height between the first and second convex portions 134b and 134c. In this case, in the crystal element 130, at least one of the X-axis directional length, the Z'-axis directional length, and the Y'-axis directional height is different between the first and second convex portions 134b and 134c. That is, if the X-Z' plane of the first convex portion 134b has a first planar shape, and the X-Z' plane of the second convex portion 134c has a second planar shape, at least one of the area and the planar shape is different between the first and second planar shapes in the crystal element 130. Alternatively, the first height HR1 of the first convex portion 134b is different from the second height HR2 of the second convex portion 134c.

In the crystal element 130, the frequency is adjusted by thinning the thickness of the excitation electrode 131 in the +Y'-axis side face of the crystal element 130 or the like after the crystal element 130 is placed on the hollow portion 121 of the package 120. For this reason, if the crystal element 130 is formed to increase the area of the excitation electrode 131 in the +Y'-axis side, the frequency can be easily adjusted, which is preferable.

Second Embodiment

As described in the first embodiment, in the crystal element, generation of the third overtone frequency is suppressed by preventing the first planar shape of the first convex portion and the second planar shape of the second convex portion from matching and overlapping with each other in the Y'-axis direction. For this reason, various combinations may be conceivable by changing the first planar shape of the first convex portion and the second planar shape of the second convex portion. Hereinafter, a modification of the crystal element will be described. In the following description, like reference numerals denote like elements as in the crystal element 130, and description thereof will not be repeated.

<Configuration of Crystal Element 230>

In the crystal element 230, the first convex portion 134b is formed in the +Y'-axis side face (referring to FIG. 4A), and the second convex portion 234c is formed in the −Y'-axis side face. The crystal element 230 is similar to the crystal element 130 in configurations other than the second convex portion 234c and the excitation electrode 231 formed in the second convex portion 234c.

Figure 4B:
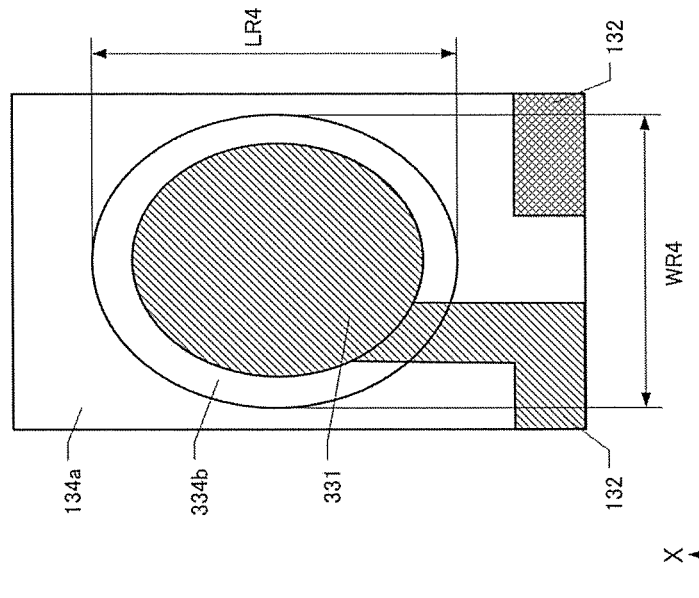
FIG. 4B is a top plan view illustrating the +Y'-axis side face of the crystal element 330.
Figure 4A:
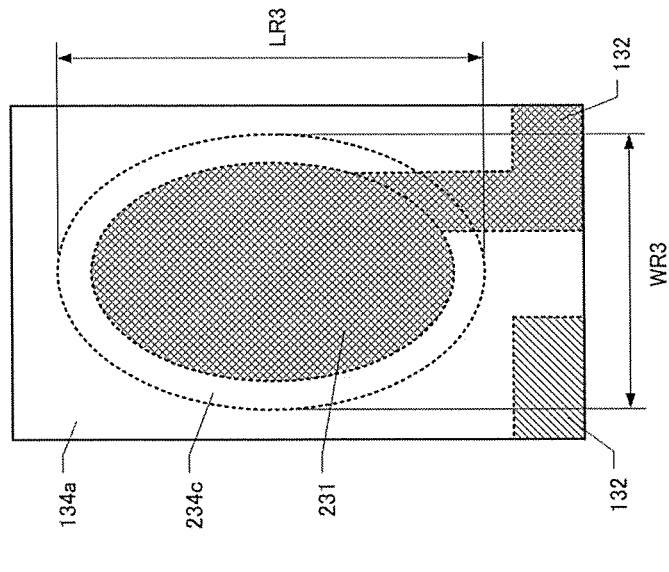
FIG. 4A is a top plan view illustrating the −Y'-axis side face of the crystal element 230.

FIG. 4A is a top plan view illustrating the −Y'-axis side face of the crystal element 230. FIG. 4A illustrates a top plan view illustrating the −Y'-axis side face of the crystal element 230 as seen from the +Y'-axis side of the crystal element 230 through the crystal element 230. The second convex portion 234c formed in the −Y'-axis side of the crystal element 230 has an elliptical plane. The excitation electrode 231 is formed in the −Y'-axis side face of the second convex portion 234c, and the extraction electrode 132 is extracted from the excitation electrode 231. The X-axis directional length of the second convex portion 234c is set to the major axis length LR3, and the Z'-axis directional length is set to the minor axis length WR3. The planar shape of the second convex portion 234c is elliptical, which is different from the first convex portion 134b having a rectangular shape.

<Configuration of Crystal Element 330>

In the crystal element 330, the first convex portion 334b is formed in the +Y'-axis side face, and the second convex portion 234c is formed in the −Y'-axis side face (referring to FIG. 4A).

FIG. 4B is a top plan view illustrating the +Y'-axis side face of the crystal element 330. The first convex portion 334b formed in the +Y'-axis side of the crystal element 330 has an elliptical planar shape. The excitation electrode 331 is formed in the +Y'-axis side face of the first convex portion 334b, and the extraction electrode 132 is extracted from the excitation electrode 331. The X-axis directional length of the first convex portion 334b is set to the major axis length LR4, and the Z'-axis directional length is set to the minor axis length WR4. In the crystal element 330, at least a difference is generated between the minor axis lengths WR3 and WR4, between the major axis lengths LR3 and LR4, or between the first height of the first convex portion 334b and the second height of the second convex portion 234c.

In the crystal elements 230 and 330, generation of the third overtone frequency in the crystal element is prevented by setting a different planar shape between the first and second convex portions. In addition, the planar shapes of the first and second convex portions 334b and 234b may be circular.

Third Embodiment

In the crystal element, a frame may be formed around the circumferential portion, and the circumferential portion and the frame may be connected using the connecting portion. Hereinafter, a crystal device 200 having a crystal element having a frame will be described.

<Configuration of Crystal Device 200>

Figure 5:
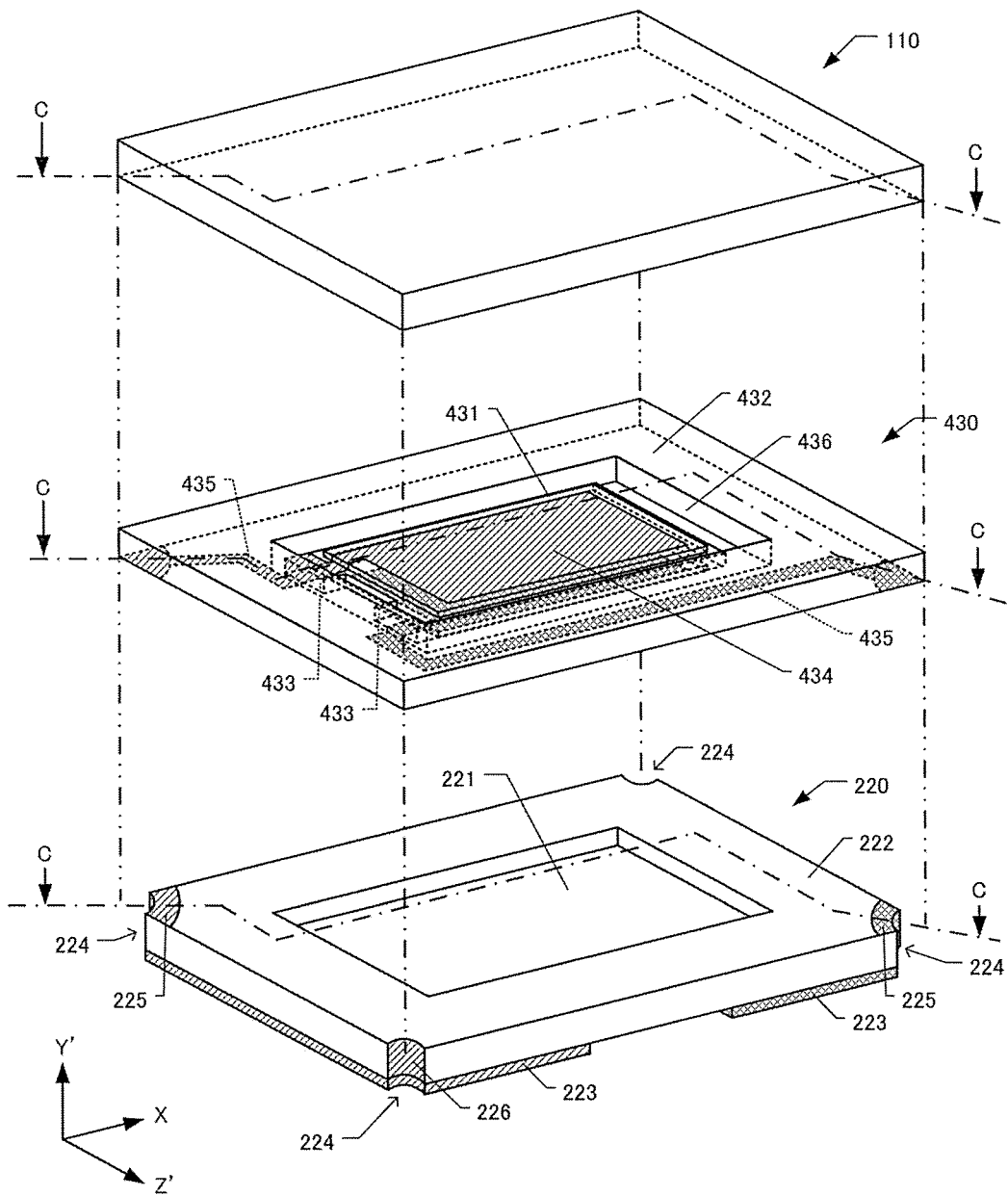
FIG. 5 is an exploded perspective view illustrating the crystal device 200.

FIG. 5 is an exploded perspective view illustrating the crystal device 200. The crystal device 200 includes a lid plate 110, a base plate 220, and a crystal element 430. In the crystal element 430, for example, an AT-cut crystal element is used. In the base plate 220, for example, glass, crystal, and the like is used as a base material.

The crystal element 430 includes an excitation electrode 431 which vibrates at a predetermined frequency, a frame 432 surrounding the excitation electrode 431, and a connecting portion 433 which connects the frame 432 and the excitation electrode 431. The connecting portion 433 is connected to each of the +Z'-axis side edge and the −Z'-axis side edge of the −X-axis side of the excitation electrode 431. The area other than the connecting portion 433 between the excitation electrode 431 and the frame 432 corresponds to a penetrating trench 436 that penetrates through the crystal element 430 in the Y'-axis direction. The excitation electrode 434 is formed in the +Y'-axis side face and the −Y'-axis side face of the excitation electrode 431, and the extraction electrode 435 is extracted from each excitation electrode 434 through the connecting portion 433 to the frame 432.

The base plate 220 is arranged in the −Y'-axis side of the crystal element 430. The base plate 220 is formed in a rectangular shape having a long side in the X-axis direction and a short side in the Z'-axis direction. A pair of mounting terminals 223 are formed in the −Y'-axis side face of the base plate 220. The mounting terminal 223 is fixed on and electrically connected to a print board and the like through soldering, so that the crystal device 200 is mounted on the print board. In addition, the castellated portion 224 is formed in the lateral faces of four corners of the base plate 220, and the lateral electrode 226 is formed in the castellated portion 224. The hollow portion 221 is formed in the +Y'-axis side face of the base plate 220, and the bonding face 222 is formed around the hollow portion 221. In addition, the connecting terminal 225 is formed around the castellated portion 224 in four corners of the bonding face 222. The connecting terminal 225 is electrically connected to the mounting terminal 223 through the lateral electrode 226 formed in the castellated portion 224. The bonding face 222 of the base plate 220 is bonded to the −Y'-axis side face of the frame 432 of the crystal element 430 by interposing the sealing material 142 (referring to FIG. 6). Furthermore, the connecting terminal 225 and the extraction electrode 435 of the crystal element 430 are electrically connected.

Figure 6:
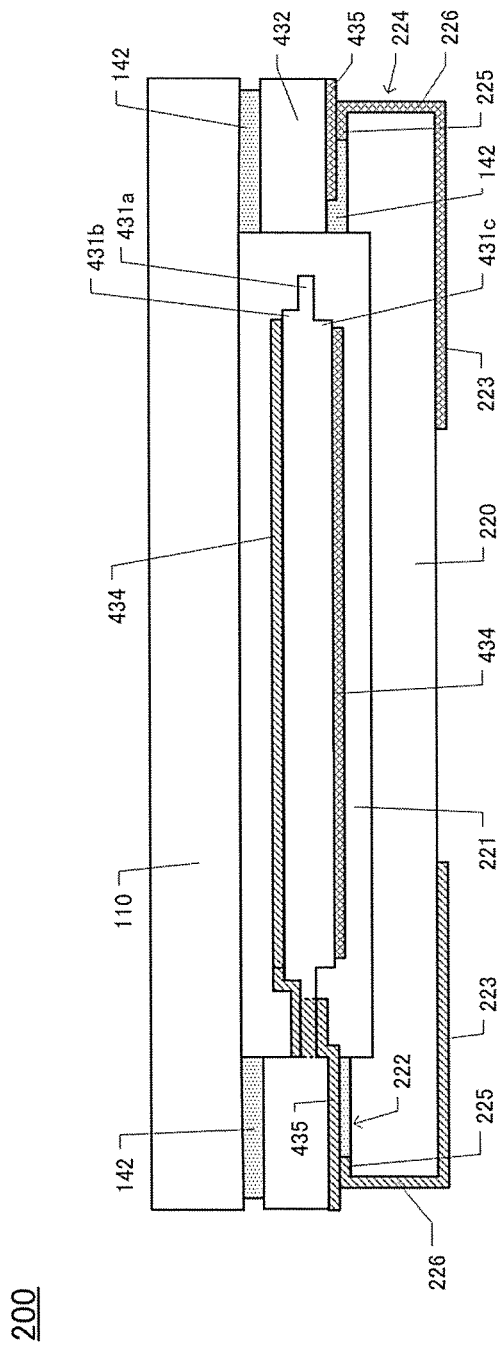
FIG. 6 is a cross-sectional view taken along a line C-C of FIG. 5.

FIG. 6 is a cross-sectional view taken along a line VI-VI of FIG. 5. In the crystal device 200, the lid plate 110 is bonded to the +Y'-axis side face of the frame 432 of the crystal element 430 by interposing the sealing material 142. The bonding face 222 of the base plate 220 is bonded to the −Y'-axis side face of the frame 432 by interposing the sealing material 142. In order to bond the frame 432 of the crystal element 430 and the bonding face 222 of the base plate 220, the extraction electrode 435 formed in the −Y'-axis side face of the frame 432 and the connecting terminal 225 formed in the bonding face 222 of the base plate 220 are electrically connected. As a result, the excitation electrode 434 is electrically connected to the mounting terminal 223 through the extraction electrode 435, the connecting terminal 225, and the lateral electrode 226. In addition, the crystal element 430 is a mesa-structure crystal element having the circumferential portion 431a formed around the excitation portion 431, the first convex portion 431b formed in the center side from the circumferential portion 431a of the +Y'-axis side face of the excitation portion 431, and the second convex portion 431c formed in the center side from the circumferential portion 431a of the −Y'-axis side face of the excitation portion 431.

FIG. 7A is a top plan view illustrating the +Y'-axis side of the crystal element 430. In the +Y'-axis side face of the crystal element 430, the first convex portion 431b and circumferential portion 431a formed around the first convex portion 431b are provided. The excitation electrode 434 is formed in the first convex portion 431b. The extraction electrode 435 is extracted from the excitation electrode 434 to the −Y'-axis side face of the connecting portion 433 through the +Y'-axis side face of the connecting portion 433 in the −Z'-axis side and the −Z'-axis side lateral face 433a of the connecting portion 433 in the −Z'-axis side. In addition, the X-axis directional length of the first convex portion 431b is set to the length LR5, and the Z'-axis directional length is set to the length WR5.

FIG. 7B is a top plan view illustrating the −Y'-axis side face of the crystal element 430 as seen from the +Y'-axis side. FIG. 7B is a top plan view illustrating the −Y'-axis side face of the crystal element 430 as seen from the +Y'-axis side of the crystal element 430 through the crystal element 430. The second convex portion 431c is formed in the −Y'-axis side face of the crystal element 430, and the circumferential portion 431a is arranged around the second convex portion 431c. The excitation electrode 434 is formed in the −Y'-axis side face of the second convex portion 431c. The extraction electrode 435 is extracted from the excitation electrode 434 through the connecting portion 433 in the +Z'-axis side to the +Z'-axis side corner of the +Z'-axis side of the frame 432. In addition, in the connecting portion 433 in the −Z'-axis side, the extraction electrode 435 extracted from the excitation electrode 434 formed in the +Y'-axis side is extracted to the −Y'-axis side face of the connecting portion 433 through the lateral face 433a of the connecting portion 433. The extraction electrode 435 extends to the −Z'-axis side corner of the −X-axis side. In addition, the X-axis directional length of the second convex portion 434c is set to the length LR6, and the Z'-axis directional length is set to the length WR6.

In the crystal element 430, at least a dimension is different between the lengths LR5 and LR6, between the lengths WR5 and WR6, and between the first height which is a height from the circumferential portion 431a of the first convex portion 431b and the second height which is a height from the circumferential portion 431a of the second convex portion 431c. That is, if a shape of the X-Z' plane of the first convex portion 431b is referred to as a first planar shape, and a shape of the X-Z' plane of the second convex portion 431c is referred to as a second planar shape, in the crystal element 430, at least one of the area and the planar shape is different between the first planar shape and the second planar shape. Alternatively, the first height of the first convex portion 431b is different from the second height of the second convex portion 431c.

<Configuration of Crystal Element 530>

In the crystal element, the corner of the circumferential portion may be chamfered. Hereinafter, the crystal element 530 in which the corner of the circumferential portion is chamfered will be described.

Figures 8A, 8B, 8C, 8D:
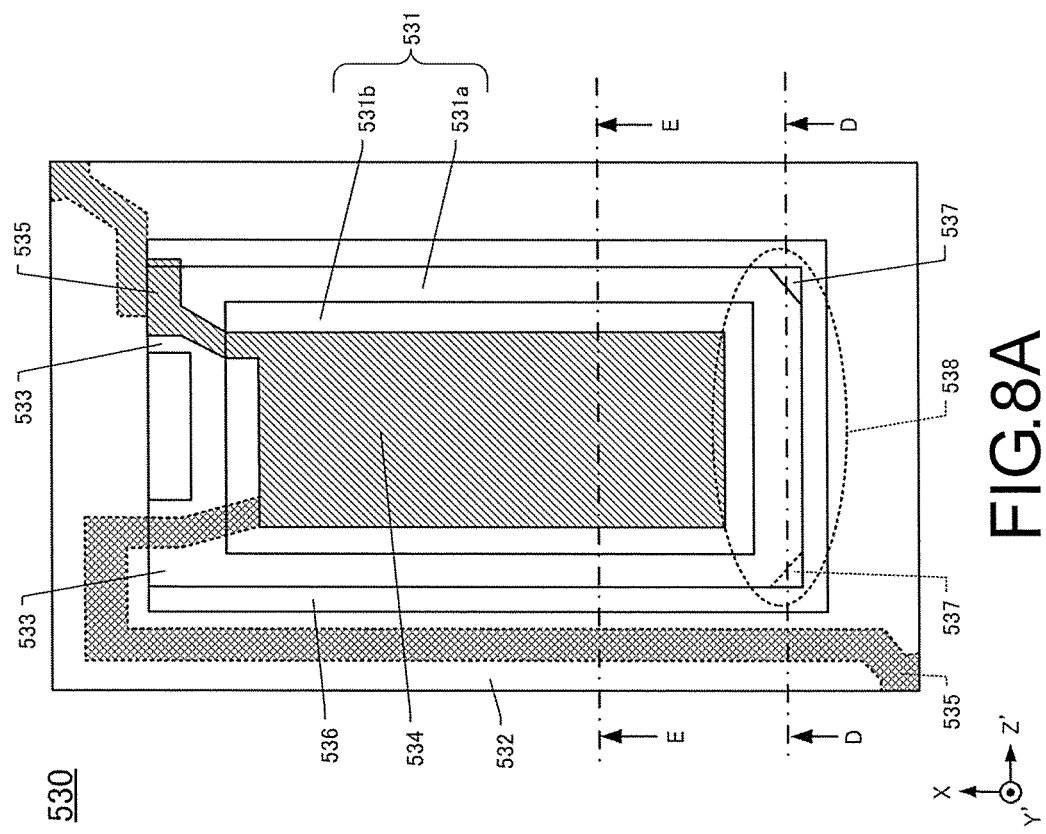
FIG. 8A is a top plan view illustrating the crystal element 530.
FIG. 8B is an enlarged perspective view illustrating a portion 538 indicated by a dotted line of FIG. 8A.
FIG. 8C is a cross-sectional view taken along a line D-D of FIG. 8A.
FIG. 8D is a cross-sectional view taken along a line E-E of FIG. 8A.

FIG. 8A is a top plan view illustrating the crystal element 530. The crystal element 530 includes an excitation portion 531, a frame 532, and a connecting portion 533. The connecting portion 533 is connected to each of both ends of the +X-axis side of the excitation portion 531. A penetrating trench 536 penetrating through the crystal element 530 in the Y'-axis direction is formed in the area other than the connecting portion 533 between the excitation portion 531 and the frame 532. The circumferential portion 531a is formed around the excitation portion 531. The first convex portion 531b is formed in the center side from the circumferential portion 531a in the +Y'-axis side face of the crystal element 530, and the second convex portion 531c is formed in the center side from the circumferential portion 531a in the −Y'-axis side face of the crystal element 530 (refer to FIG. 8D). That is, the excitation portion 531 includes the circumferential portion 531a, the first convex portion 531b, and the second convex portion 531c. The excitation electrode 534 is formed in each surface of the first and second convex portions 531a and 531c. The extraction electrode 535 is extracted from each excitation electrode 534. The extraction electrode 535 is formed to extend to the +Z'-axis side corner of the +X-axis side and the −Z'-axis side corner of the −X-axis side in the −Y'-axis side face of the frame 532. In addition, in the crystal element 530, the −X-axis side corner of the circumferential portion 531a is chamfered.

FIG. 8B is an enlarged perspective view illustrating the portion indicated by the dotted line 538 of FIG. 8A. In the crystal element 530, the −Z'-axis side corner of the −X-axis side and the +Z'-axis side corner of the −X-axis side of the circumferential portion 531a are chamfered. In the −Z'-axis side corner, the corner adjoining with the −Y'-axis side face is chamfered. In the +Z'-axis side corner, the corner adjoining with the +Y'-axis side face is chamfered. In FIG. 8B, the chamfered face is indicated by the face 537.

FIG. 8C is a cross-sectional view taken along a line D-D of FIG. 8A. In the crystal element 530, the +Z'-axis side lateral face and the −Z'-axis side lateral face of the circumferential portion 531a is inclined from the +Y'-axis direction to the −Z'-axis direction. Such inclination of the lateral face is generated due to a difference of the etching rate for each axial direction of the crystal element. In the AT-cut crystal, since the etching rate is rapid between the +Y'-axis direction and the −Z'-axis direction and between the −Y'-axis direction and the +Z'-axis direction, such a lateral face is formed. In addition, the chamfered face 537 is also formed using such an etching rate difference between each axial direction.

FIG. 8D is a cross-sectional view taken along a line E-E of FIG. 8A. In the excitation electrode 531, the first convex portion 531 is formed in the +Y'-axis side face, and the second convex portion 531c is formed in the −Y'-axis side face. In the crystal element 530, if a shape of the X-Z' plane of the first convex portion 531b is referred to as a first planar shape, and a shape of the X-Z' plane of the second convex portion 531c is referred to as a second planar shape, at least one of the area and the planar shape is different between the first and second planar shapes. Alternatively, the height of the first convex portion 531b is different from the height of the second convex portion 531c.

In the related art, a so-called bevel processing has been performed to polish the excitation portion in an arc shape in the crystal element. Through this processing, it is possible to suppress generation of undesired vibration in the crystal element and reduce the crystal impedance (CI) value. In the crystal element 530, the corner of the circumferential portion 531a is chamfered. Therefore, it is possible to allow the crystal element 530 to have a shape close to the bevel-processed shape and reduce the CI value of the crystal element. Since the main vibration of the AT-cut crystal element is generated in a thickness direction (Y'-axis direction), the vibration generated in the Z'-axis direction becomes undesired vibration. For this reason, if the chamfered portion is formed in a curved face shape, a boundary condition for generating a vibration in the Z'-axis direction is not satisfied. Therefore, generation of the vibration in the Z'-axis direction can be easily suppressed, which is preferable.

Furthermore, in the crystal element 530, the −X-axis side corner of the excitation portion 531 is chamfered. Since the etching rate of crystal in the +X-axis direction is rapid, the excitation portion 531 is excessively etched when the +X-axis side corner is chamfered, and the area of the excitation portion 531 may be narrowed in some cases. In the crystal element 530, the connecting portion 533 is formed in the +X-axis side of the excitation portion 531, and the −X-side corner is etched. As a result, it is possible to suppress the etching rate and suppress the area of the excitation portion 531 from being excessively narrowed.

In the mesa-structure crystal element described above, the first convex portion may be a circle or an ellipse as seen from a normal direction of a first principal face, the second convex portion may be a circle or an ellipse as seen from a normal direction of a second principal face opposite to the first principal face, and a radius of the circle or a major axis length or a minor axis length of the ellipse of the first convex portion may be different from a radius of the circle or a major axis length or a minor axis length of the ellipse of the second convex portion.

In the mesa-structure crystal element described above, the first convex portion may be a circle or an ellipse as seen from a normal direction of the first principal face, and the second convex portion may be a rectangle as seen from a normal direction of the second principal face.

In the mesa-structure crystal element described above, the first convex portion may be a rectangle as seen from a normal direction of the first principal face, the second convex portion may be a rectangle as seen from a normal direction of the second principal face, and a long-side length of the rectangle of the first convex portion may be different from a long-side length of the rectangle of the second convex portion, or a short-side length of the rectangle of the first convex portion may be different from a short-side length of the rectangle of the second convex portion.

The mesa-structure crystal element described above may further include: a frame spaced from an outer circumference of the circumferential portion to surround the circumferential portion, the first convex portion, and the second convex portion; and a connecting portion that connects the circumferential portion and the frame.

In the mesa-structure crystal element described above, the circumferential portion may be a rectangle as seen from a normal direction of the first principal face, the connecting portion may be formed in a first short side of the rectangle of the circumferential portion, and corners formed by a second short side opposite to the first short side and two long sides may be chamfered.

The crystal element and the crystal device disclosed herein are capable of suppressing generation of frequencies other than the fundamental wave.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:
1. A mesa-structure crystal element comprising:
a circumferential portion having a thin thickness;
a first convex portion formed in a center side from the circumferential portion and having a first height from the circumferential portion in a first principal face and a first planar shape; and
a second convex portion formed on a plane in a center side from the circumferential portion and having a second height from the circumferential portion in a second principal face opposite to the first principal face and a second planar shape,
wherein at least one of an area and a planar shape is different between the first planar shape of the first convex portion and the second planar shape of the second convex portion, or the first height of the first convex portion is different from the second height of the second convex portion.

2. The mesa-structure crystal element according to claim 1, wherein the first convex portion is a circle or an ellipse as seen from a normal direction of the first principal face,
 the second convex portion is a circle or an ellipse as seen from a normal direction of the second principal face, and
 a radius of the circle or a major axis length or a minor axis length of the ellipse of the first convex portion is different from a radius of the circle or a major axis length or a minor axis length of the ellipse of the second convex portion.

3. The mesa-structure crystal element according to claim 1, wherein the first convex portion is a circle or an ellipse as seen from a normal direction of the first principal face, and
 the second convex portion is a rectangle as seen from a normal direction of the second principal face.

4. The mesa-structure crystal element according to claim 1, wherein the first convex portion is a rectangle as seen from a normal direction of the first principal face,
 the second convex portion is a rectangle as seen from a normal direction of the second principal face, and
 a long-side length of the rectangle of the first convex portion is different from a long-side length of the rectangle of the second convex portion, or a short-side length of the rectangle of the first convex portion is different from a short-side length of the rectangle of the second convex portion.

5. The mesa-structure crystal element according to claim 1, further comprising:
 a frame spaced from an outer circumference of the circumferential portion to surround the circumferential portion, the first convex portion, and the second convex portion; and
 a connecting portion that connects the circumferential portion and the frame.

6. The mesa-structure crystal element according to claim 5, wherein the circumferential portion is a rectangle as seen from a normal direction of the first principal face,
 the connecting portion is formed in a first short side of the rectangle of the circumferential portion, and
 corners formed by a second short side opposite to the first short side and two long sides are chamfered.

7. A crystal device comprising:
 the crystal element according to claim 1, the crystal element having an excitation electrode formed in the first convex portion and the second convex portion and an extraction electrode extracted from the excitation electrode to the circumferential portion;
 a base plate that has a connecting terminal connected to the extraction electrode and houses the crystal element; and
 a lid plate bonded to the base plate to encapsulate the crystal element.

8. A crystal device comprising:
 the crystal element according to claim 5, the crystal element having an excitation electrode formed in the first convex portion and the second convex portion and an extraction electrode extracted from the excitation electrode through the connecting portion to the frame;
 a base plate that has a connecting terminal connected to the extraction electrode and is bonded to the frame; and
 a lid plate bonded to the frame to encapsulate the crystal element.

\* \* \* \* \*